United States Patent [19]

McNally

[11] 4,066,973
[45] Jan. 3, 1978

[54] ANALOG SIGNAL ISOLATOR

[75] Inventor: Paul F. McNally, Gibsonia, Pa.

[73] Assignee: Contraves-Goerz Corporation, Pittsburgh, Pa.

[21] Appl. No.: 723,496

[22] Filed: Sept. 15, 1976

[51] Int. Cl.² .............................................. H03F 3/38
[52] U.S. Cl. ........................................ 330/10; 330/59
[58] Field of Search ................. 330/10, 33, 59, 207 A; 307/311; 250/551

[56] References Cited

U.S. PATENT DOCUMENTS

| | | | |
|---|---|---|---|
| 3,315,176 | 4/1967 | Biard | 330/59 |
| 3,327,239 | 6/1967 | Carpenter | 330/59 |
| 3,590,251 | 6/1971 | Vosteen | 330/59 X |
| 3,810,034 | 5/1974 | Brunsch | 330/59 |
| 3,852,731 | 12/1974 | Hollands | 307/261 X |
| 3,893,037 | 7/1975 | Herbert | 330/59 |
| 3,913,001 | 10/1975 | Kayama | 250/551 X |

OTHER PUBLICATIONS

Witkover, "Pulse Width Modulated Optical Data Link", *The Review of Scientific Instruments*, vol. 40, No. 3, Mar. 1969, pp. 469–472.

*Primary Examiner*—James B. Mullins
*Attorney, Agent, or Firm*—Robert D. Yeager; Howard G. Massung

[57] ABSTRACT

Isolating apparatus is disclosed which provides electrical isolation between an analog signal input and an equivalent analog signal output. The input analog signal is converted to a series of positive and negative pulses. Optical coupling devices are responsive to the series of positive and negative pulses for providing a series of similar positive and negative pulses which are electrically isolated but optically coupled. These isolated pulses are then converted to the equivalent analog signal output. The optical coupling comprises photo emitters one of which is activated when the analog to pulse converter output is positive and another of which is activated when it is negative. The photo emitters are operably associated with photo detectors which are operable in a switching mode. Feedback is not required around the optical coupling devices. An averaging circuit at the output provides an analog representation of the input signal.

15 Claims, 6 Drawing Figures

ANALOG SIGNAL ISOLATOR

BACKGROUND OF THE INVENTION

1. Field of the Invention

This invention relates to signal isolators and more particularly to an analog signal isolator utilizing optical couplers in a switching mode to provide electrical isolation between its analog input and output.

2. Description of the Prior Art

The prior art analog isolators or couplers using optical coupling normally operate the optical couplers in a linear region. This may require use of a feedback circuit around the coupling devices and normally an additional pair of optical couplers to provide stable signal reproduction. When the optical couplers are used in a linear mode, matching operating characteristics of these devices is critical.

U.S. Pat. Nos. 3,315,176; 3,590,251; 3,327,239 and 3,893,037 are exemplary of devices which utilize various types of optical couplers in their linear range. In addition U.S. Pat. No. 3,893,037 illustrates the use of optical couplers for feedback signal coupling. U.S. Pat. No. 3,810,034 discloses an apparatus for transmitting DC signals from an input circuit to an electrically isolated output circuit. For transmission of an analog signal the photo coupling devices in U.S. Pat. No. 3,810,034 would have to operate in a linear range.

Prior art devices which use optical coupling for providing electrical isolation usually operate the optical coupling devices in their linear range. The photo coupling devices when operated in their linear range cause the circuit to be sensitive to various operating characteristics such as linearity, gain, temperature sensitivity and other device parameters. Thus, matching and selecting characteristics of necessary photo coupling devices becomes a major problem.

SUMMARY OF THE INVENTION

An analog signal isolator is provided which allows an analog input signal to be electrically isolated from an equivalent analog output signal. The potential difference between the input and output of the isolator may be several thousand volts. The only coupling between the input and the output of the analog signal isolator is by optical paths between photo emitters and photo sensors. The photo coupling devices are operated only as switching devices and this allows a circuit to be designed which is almost totally independent of the device characteristics.

In one embodiment an analog isolator is provided with an input, to which the analog signal to be isolated is applied, and an analog to pulse converter which converts the analog signal to positive and negative pulses. Optical coupling devices are connected to the analog to pulse converter output for providing a series of corresponding positive and negative pulses which are electrically isolated from the isolator input. These positive and negative pulses which are electrically isolated from the isolator input are fed to a pulse to analog converter which changes them to an analog signal representative of the analog signal applied to the input.

The analog to pulse converter can be a pulse width modulator or a two-state modulated amplifier. The optical coupler can be any of the numerous commercially available devices such as a light emitting diode and a photo sensitive transistor. The optical coupling device is used only as a switch and is therefore rather insensitive to variations of linear operating characteristics. The output pulse to analog converter includes an averaging circuit which averages the series of positive and negative pulses applied thereto to provide an analog output. Appropriate amplification can be provided for increasing the signal strength of the analog output. Operating the analog couplers only as on or off devices provides for high efficiency and little power dissipation in the devices.

By providing an appropriate constant frequency oscillator signal as one input to the isolator, the switching frequency of the isolator can be maintained relatively constant. In one embodiment more than one photo emitter can be connected in series to operate a bridge configured output.

It is an object of this invention to teach an analog signal isolator which uses optical coupling, wherein the optical coupling devices are operated only in a switching mode.

BRIEF DESCRIPTION OF THE DRAWINGS

For a better understanding of the invention, reference may be had to the preferred embodiments exemplary of the invention shown in the accompanying drawings, in which.

DESCRIPTION OF THE PREFERRED EMBODIMENT

Figure 1:
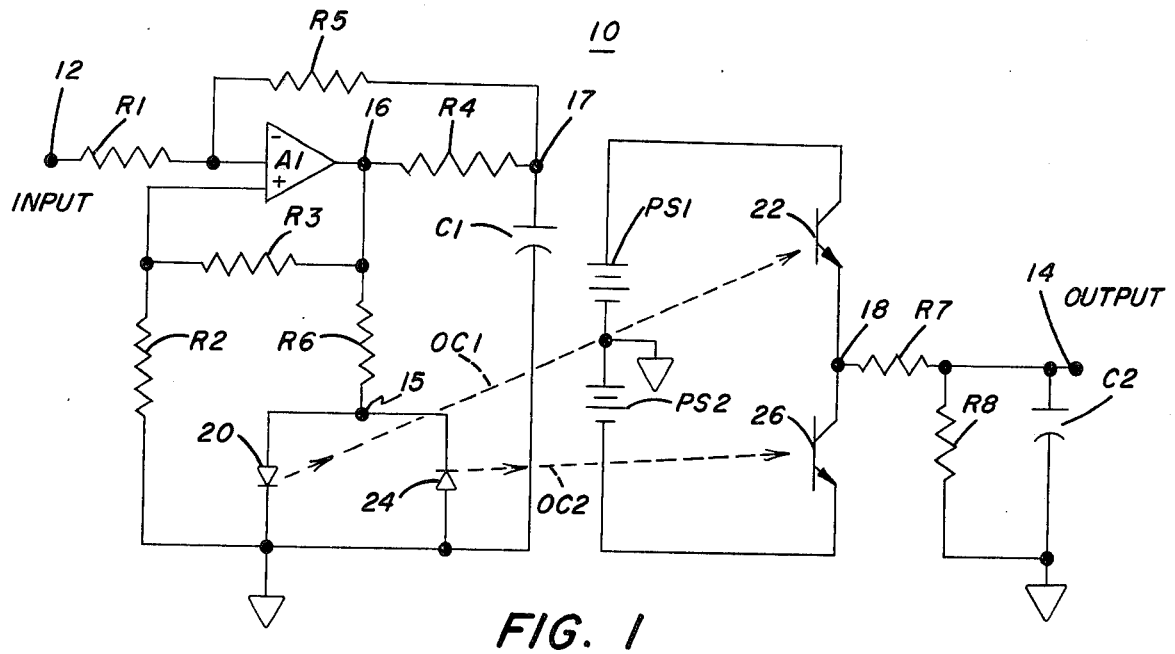
FIG. 1 is a circuit diagram of an analog isolator utilizing the teaching of the present invention.

Referring now to FIG. 1 there is shown a circuit schematic of an analog signal isolator 10 constructed in accordance with the teaching of the present invention. An input 12 is provided for receiving an analog input signal. An output 14 provides an analog output signal which is essentially the same as the analog signal applied to input 12, but electrically isolated from input 12. The analog isolator 10 provides a means of transmitting an analog signal from one device to another while maintaining electrical isolation between their power supplies. For example, on the circuit shown, the signal applied to input 12 may be generated by a circuit or a device whose common potential is several thousand volts different than the common potential of the devices connected to the output 14. The only coupling between the circuits connected to the input 12 and the circuits connected to the output 14 is through optic coupler OC1 and optic coupler OC2. Optic coupler OC1 consists of light emitting diode 20 and a photo sensitive transistor 22. Optic coupler OC2 consists of a light emitting diode 24 and a photo sensitive transducer 26. It is to be understood that although the teaching of the present invention is described for light emitting diodes and photo sensitive transistors it can also be applied with other types of optical coupling devices. Optic couplers OC1 and optic coupler OC2 are operated in a switching mode and therefore are not greatly affected by the linear characteristics of the various devices selected.

Amplifier A1 accepts an input signal on the input summing resistor R1. The input signal causes a current to flow through resistor R1 which is balanced by a current flow through feedback resistor R5. Amplifier A1 is a switching amplifier and will switch from its full positive state to its full negative state in response to the input signal applied thereto. Resistors R2 and R3 are connected as a voltage divider. The junction between resistors R2 and R3 is connected to an input of amplifier A1, and this provides a feedback signal which sets a hysteresis point about which amplifier A1 will operate. Resistor R4 and capacitor C1 provide an averaging circuit for the switching waveform output of amplifier A1. This averaged waveform, which includes a cyclic variation, is fed back through resistor R5 to an input of amplifier A1. The resistor R4 and capacitor C1 do not provide perfect averaging and the signal at point 17 contains a component variable as a function of time, which can cause switching of the amplifier A1. The feedback signal through resistor R5 and the input signal through resistor R1 are combined and this combined signal when compared with the input applied to the positive terminal of amplifier A1 causes switching of amplifier A1. Amplifier A1 will switch from its full positive state to its full negative state at a frequency and duty cycle demanded by the input signal level. In the embodiment as shown in FIG. 1, the frequency of the switching amplifier may thus vary during operation.

Light emitting diodes 20 and 24 are connected to the output of amplifier A1 through resistor R6. Resistor R6 limits current flow through light emitting diodes 20 and 24. As the output at node 16 from amplifier A1 switches from its positive to negative state, light emitting diodes 20 and 24 are alternately energized. The light outputs from the light emitting diodes 20 and 24 are coupled to photo transistors 22 and 26, respectively, which switch on and off in synchronism with the light emitting diodes 20 and 24. Photo sensitive transistors 22 and 26 are operated only full on or full off. Thus, transistors 22 and 26 are operated as switching devices having only two stable states. That is, transistors 22 and 26 are either on or off or traveling between one of these states. Photo transistors 22 and 26 are connected to isolated positive and negative power supplies PS1 and PS2, respectively. These power supplies PS1 and PS2 are shown for convenience as batteries in FIG. 1. Photo transistors 22 and 26 switch on and off in synchronism with the light emitting diodes 20 and 24 alternately connecting the positive supply PS1 and the negative supply PS2 to node 18. The signal waveforms at node 18 will look identical to the signal waveforms at node 16. Resistors R7, R8 and capacitor C2 provide an averaging circuit for the switching waveform present at point 18. If R7 equals R4, R8 equals R5, and C1 equals C2, then the signal at point 17 and the output signal at point 14 will be the same. If it is desirable that the output further mirror the input, then additional averaging can be provided. This additional averaging can be provided by additional electrical components or electromechanical devices connected to output 14. The circuit described provides for transmitting an analog signal from one potential to another by optical devices operated only in their switching mode. Isolator circuit 10 translates the pulse modulated signal at node 16 to an identical pulse modulated signal at node 18. The output signal from terminal 14 can be further smoothed and filtered to be made almost identical to the input analog signal applied to terminal 12.

Figure 3:
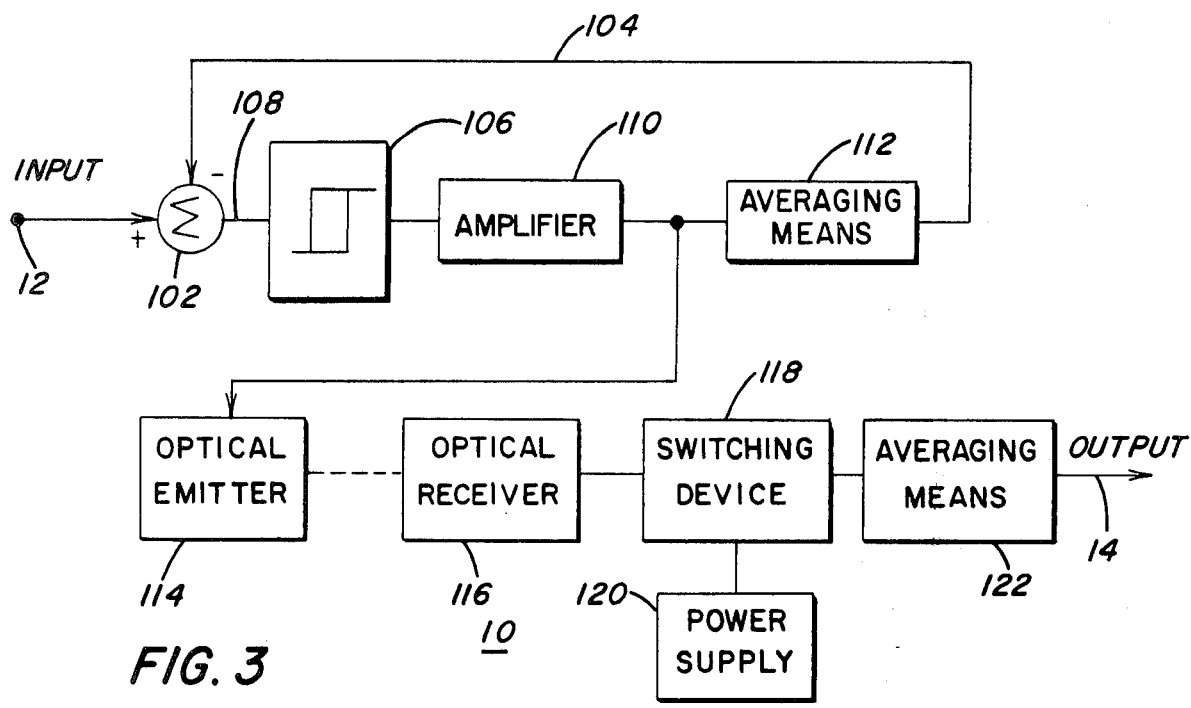
FIG. 3 is a block diagram of an analog isolator according to the teachings of the present invention.

Referring now to FIG. 3 there is shown a block diagram of an analog signal isolator 10 constructed according to the teaching of the present invention. An analog input signal is applied to input 12 and an equivalent isolated analog output signal is supplied at output 14. The input signal is combined at summing junction with a negative feedback signal supplied along line 104. The feedback signal along line 104, contains an alternating portion, and when combined with the input signal causes switching of hysteretic device 106. That is hysteretic device 106 switches between two stable states in response to the combined signal on line 108. The output of device 106 is thus a series of positive and negative pulses. Switching of device 106 occurs at a frequency which is relatively high compared to cyclic variations in the input signal applied to input 12. Amplifier 110 increases the strength of the switching signal from hysteretic device 106. It should be noted that hysteretic device 106 can exhibit either static or dynamic hysteresis. That is, the hysteresis of device 106 can be time dependent. The switching waveform at the output of amplifier 110 includes a characteristic which is representative of the input. One such characteristic is the average value of the switching waveform over a switching cycle. The output of amplifier 110 is fed to averaging means 112 which provides an averaged signal for feedback along line 104. As is known in the art, the negative feedback signal along line 104 almost balances the input signal. As the input signal varies, the negative feedback signal is changed accordingly to keep the difference along line 108 relatively small.

The output signal from amplifier 110 is also fed to optical emitter 114. Optical emitter 114 is optically coupled to optical receiver 116. That is, emitter 114 and receiver 116 are electrically isolated but optically coupled. Optical receiver 116 controls a switching device 118 whose output is a signal which is representative of the output switching signal from amplifier 110. The output of switching device 118 is a series of pulses whose magnitude is determined by the input from power supply 120. The output of switching device 118 is fed to an averaging means 122 whose output is representative of the signal applied to input 12. Depending on the circuit components, the signals processed by isolator 10 can be voltage, current or a combination.

Figure 4:
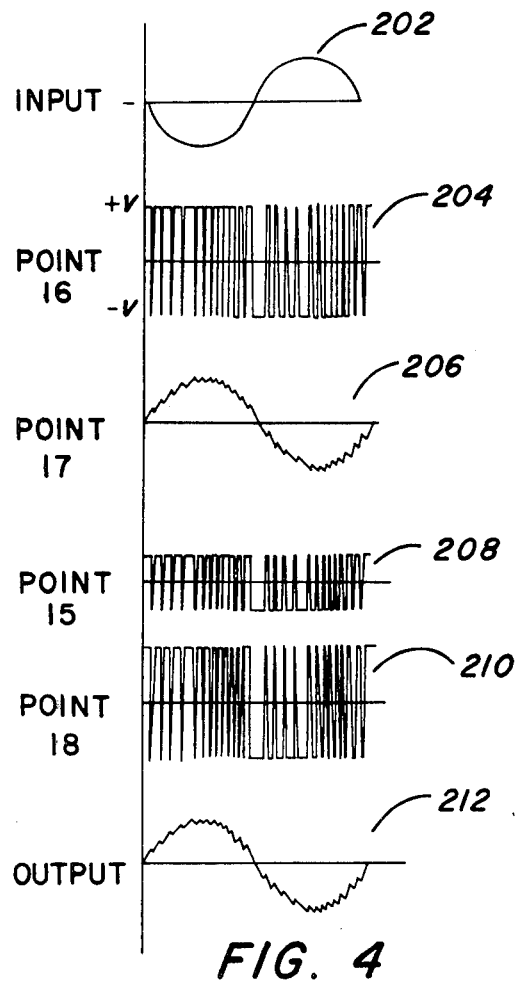
FIG. 4 shows various representative waveforms from different points in the circuit shown in FIG. 1.

Referring to FIG. 4 there are shown representative waveforms which may be expected at various points in the circuit of FIG. 1. Curve 202 represents a sine wave input applied to input 12. This input is combined with a negative feedback signal; waveform 206, from point 17 through R5. Note that wave 206 has some small cyclic variations which are related to switching of amplifier A1. When signals having waveforms 202 and 206 are combined, the composite signal includes these small cyclic variations and they can contribute to switching of amplifier A1. If a sudden or step change is made in the input signal applied to input 12, amplifier A1 may cease switching until the feedback signal has reached the proper magnitude. Waveform 204 represents a switching wave at the output of amplifier A1. The average value of the switching wave 204 over one switching cycle defines a value which is related to the input. This is, if the average value of the switching waveform for each switching cycle were plotted they would define a sine wave, related to sine wave 202. Note that there are numerous switching cycles for each cycle of wave 202.

Thus, the average values provide a good approximation of the sine wave input. When switching waveform 204 is applied to an averaging circuit, an output similar to waveform 206 can be expected.

The output of amplifier A1 is also connected to photo emitters 20 and 24. The voltage signal at point 15 is similar to the signal at point 16. The time or duration of the positive and negative pulses is the same, but the magnitude is limited by the voltage drop across the diodes 20 or 24. This diode voltage drop is approximately equal to 0.7 volts. When diode 20 or 24 is activated it turns on switching transistor 22 or 26 causing waveform 210 at point 18. The positive voltage of waveform 210 is determined by PS1 while the negative level is determined by PS2. When PS1 and PS2 are properly selected, waveforms 204 and 210, as shown in FIG. 4, are the same. The output signal at point 18 is then averaged providing the output wave 212 at point 14. Wave 212 closely approximates the input sine wave, but like the feedback signal is 180° out of phase. If necessary the output can be inverted to be in phase with the input.

Figure 2:
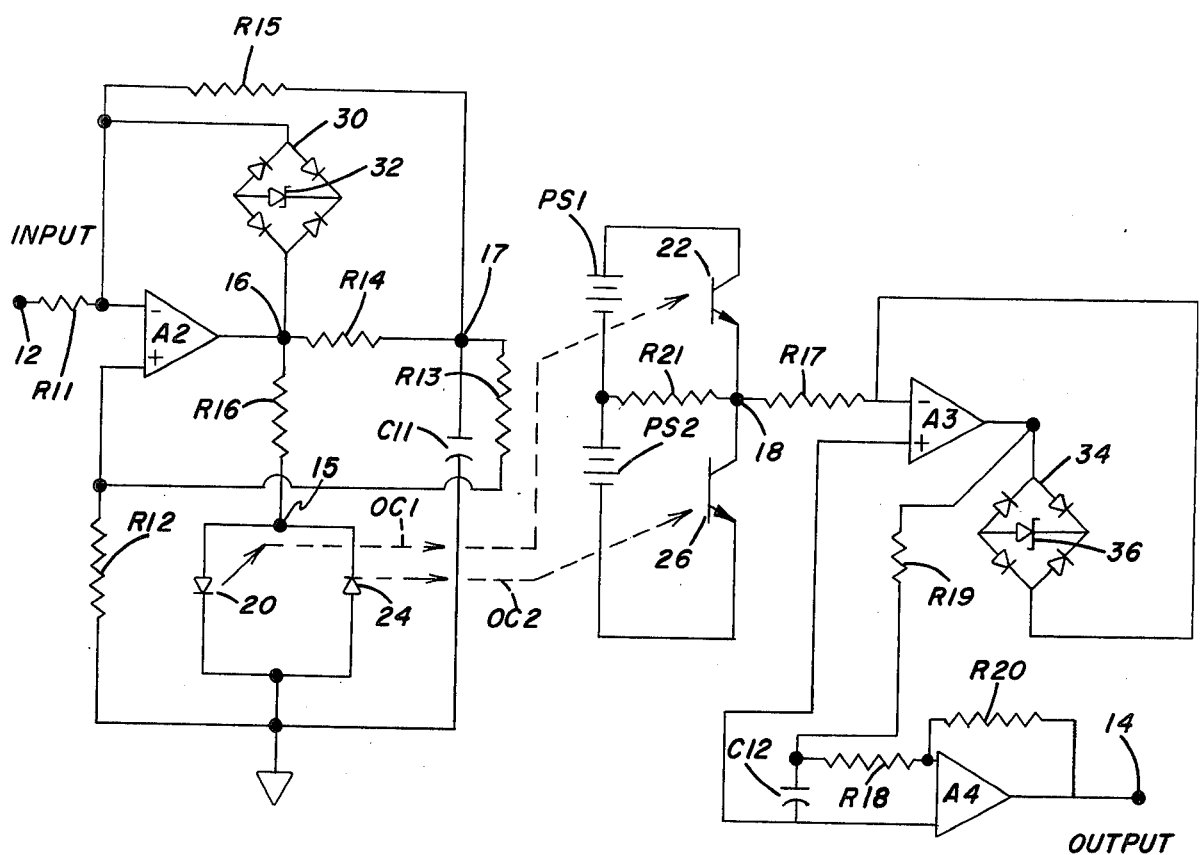
FIG. 2 is a circuit diagram of another embodiment of the present invention.

Referring now to FIG. 2 there is shown another circuit for an optical signal isolator, similar to FIG. 1, illustrating another embodiment of the present invention. Input signals are applied from input 12 through resistor R11 to amplifier A2. The input signal causes a current to flow through resistor R11 which is balanced by almost an equal current flow through the feedback resistor R15. A diode bridge 30 and a zener diode 32 are connected around amplifier A2 to control the saturation levels. That is, by providing bridge 30, the saturation level of amplifier A2 is known and determined by zener 32. Thus the voltage level of the switching signal at point 16 is not determined by the characteristics of amplifier A2, but by zener 32. Thus, a variety of different amplifiers could be substituted for A2 and the switching waveform magnitudes at point 16 would be the same. Resistors R12 and R13 are connected as a voltage divider and the signal at their common junction point is connected to the positive input of amplifier A2 which sets the hysteresis point about which amplifier A2 will operate. Resistor R14 and capacitor C11 provide an averaging circuit of the signal from the output of the amplifier A2. Thus, the switching waveform present at node 16 is averaged by capacitor C11 and resistor R14 to provide an averaged signal at node 17. The average signal at point 17 however still has certain variations from the frequency of the switching waveform present at node 16. These cyclic variations, which are present on the feedback signal through resistor R15, when combined with the input signal from terminal 12 can cause switching of amplifier A2. If desired amplifier A2 can be made to switch at a predetermined frequency by supplying an oscillator input thereto. If the magnitude of the oscillator input is properly selected, amplifier A2 will switch at the oscillator frequency most of the time. Amplifier A2 will switch from its full positive state to its full negative state at a frequency and duty cycle determined by the input signal level and the various circuit parameters. The magnitude of the voltage wave output from A2 is determined by zener 32. Light emitting diodes 20 and 24 are coupled to the output of amplifier A2 at point 16 by resistor R16. As the amplifier A2 switches from its positive to its negative state, the light emitting diodes 20 and 24 are alternately energized. The light output from light emitting diodes 20 and 24 are coupled to photo transistors 22 and 26, respectively, which switch on and off in synchronism with the light emitting diodes 20 and 24. Photo transistors 22 and 26 are connected to an isolated positive power supply, PS1, and a negative power supply, PS2, shown as batteries in FIG. 2. A switching waveform is present in the common connection between photo sensitive transistors 22 and 26, at node 18. Resistor R21 is connected between the common connection between power supplies PS1 and PS2 and the common node 18 between the photo transistors 22 and 26. The output of photo transistors 22 and 26 at node 18 is used to drive amplifier A3 through resistor R17. This causes amplifier A3, which operates in a switching mode to switch between positive and negative output levels. A full wave diode bridge 34 and a zener diode 36 are provided around amplifier A3 to control the saturation level of amplifier A3. As explained above in conjunction with amplifier A2, this will determine the magnitude of the voltage waveform output of A3. Thus power supplies PS1 and PS2 don't determine the magnitude of the switching signal at the output of A3, rather it is controlled by zener 36. Resistors 18 and 19 and capacitor C12 provide averaging for the switching waveform output of amplifier A3. This averaged signal is fed through amplifier A4 to increase signal strength. If the values of the circuit components are properly selected, the analog output 14 signal can be made very close to the analog input signal 12. This circuit provides a means of transmitting an analog signal from one potential to an equivalent analog signal at another potential by an optical path which utilizes the optical couplers as switching devices.

With the photo coupling devices used only as switches, a circuit can be designed which is almost independent of the devices linear characteristics. This has significant advantages over attempting to operate the optical coupling devices in the linear range. The disclosed circuit is efficient, simple and self-adapting to changing inputs.

Figure 5:
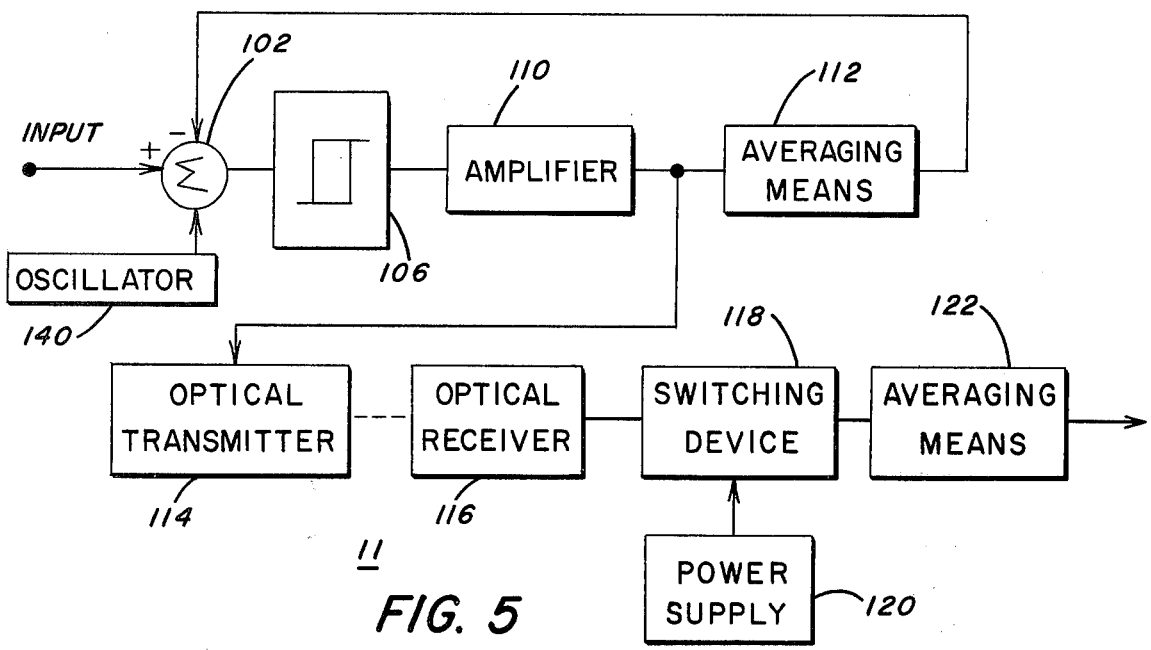
FIG. 5 is a block diagram of an analog isolator which operates at a constant switching frequency; and, FIG. 6 is a circuit diagram of an analog isolator having a bridge configured output.

Referring now to FIG. 5 there is shown a block diagram representation, similar to FIG. 3, of an embodiment utilizing a constant frequency oscillator input to summing junction 102. Operation of this isolator 11 is similar to the one shown in FIG. 3 in that hysteretic switching device 106 switches in response to the combined signal from summing junction 102. The combined signal now includes a component determined by the input from oscillator 140. If the magnitude of the oscillator input is properly selected, the frequency of the switching waveform for constant or slowly varying signals on input 12 will be fixed at the oscillator frequency. If the magnitude of oscillator 140 signal is made very large, the switching waveform frequency may always be constant. Making the oscillator signal very large, however, may have a detrimental effect on the system response. If the magnitude of the signal from oscillator 140 is made extremely small, hysteretic device 106 may be switched at a constant frequency only when the input signal is constant. With an oscillator signal of the proper magnitude and frequency the switchable device 106 will be switched at a constant frequency most of the time. When there is a fast change in input or load, hysteretic device 106 may temporarily switch at a different frequency.

Figure 6:
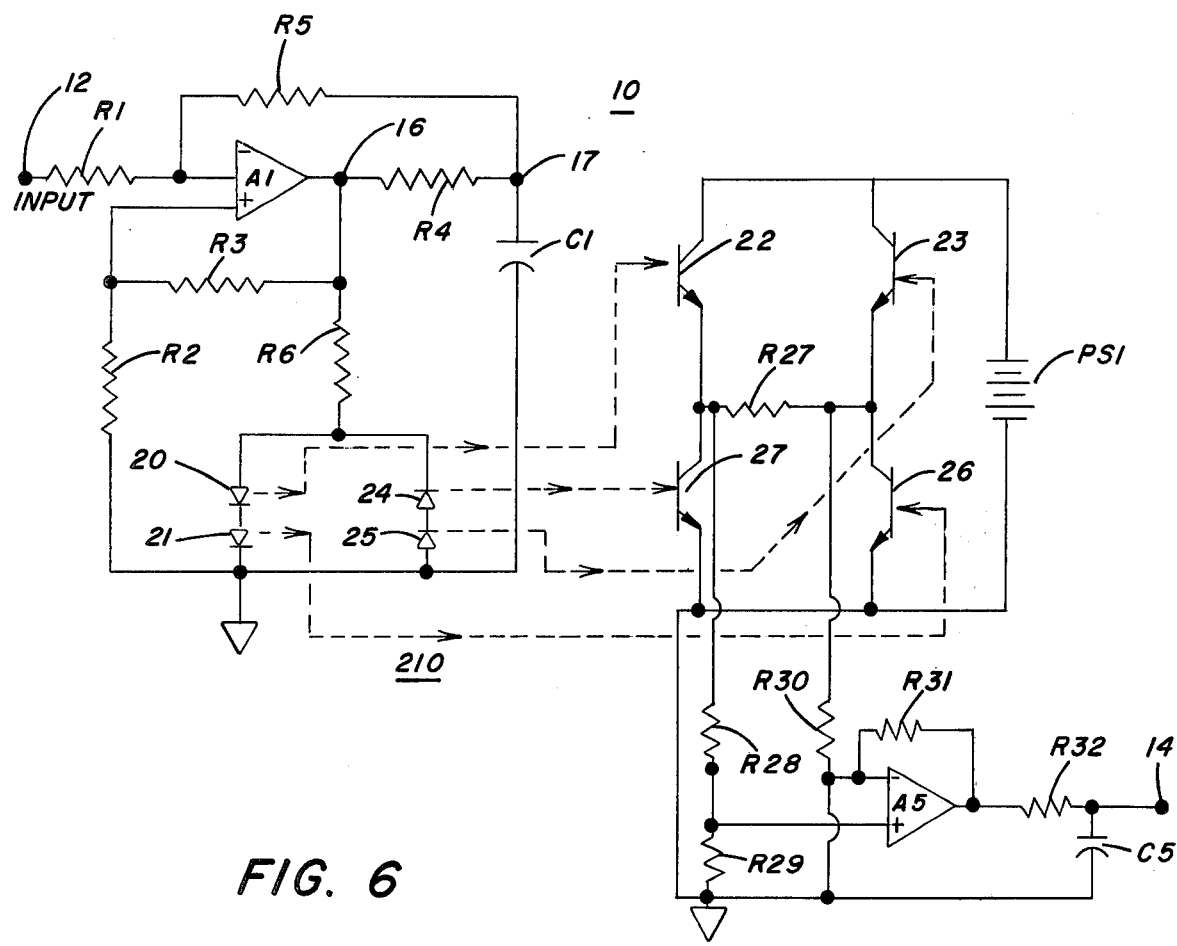

In FIG. 6 there is shown an embodiment of the invention wherein the output is formed with bridge configured switching devices. The input portion of circuit 210 is similar to circuit 10 of FIG. 1 but includes additional light emitting diodes 21 and 25 in series with light emitting diodes 20 and 24, respectively. As the output of amplifier A1 switches between its positive output level and its negative output level, a pair of diodes 20, 21 or 24, 25 are energized. When the output of amplifier A1 is positive diodes 20, 21 are energized providing a light output. When the output of amplifier A1 is negative, LED's 24 and 25 are energized providing a light output. LED's 20 and 21 are optically coupled to photo sensitive transistors 22 and 26, switching on one side of the output bridge. When LED's 24 and 25 are energized, they are optically coupled to photo sensitive transistors 23 and 27, switching on the other side of the output bridge. This configuration allows the use of only one power supply PS1 and assures the magnitude of the output positive and negative switching pulses will be equal. The output signal present across output resistors R27 is floating. A ground reference is provided by differential amplifier A5 and associated resistors R28, R29, R30 and R31. The switching waveform output of amplifier A5 is connected to an averaging circuit comprising resistors R31, R32 and capacitor C5. The output signal at terminal 14 thus provides a close approximation to the input signal applied to terminal 12.

What is claimed is:

1. An analog signal isolator comprising:
    an input for receiving an analog signal;
    an amplifier having an input and an output, switchable between a positive voltage level and a negative voltage level in response to the signal applied to its input;
    an averaging circuit connected to the output of said amplifier for providing some averaging of the amplifier output signal;
    a feedback circuit for providing a feedback signal, related to the signal on the amplifier output, which is combined with the analog signal input and the combined signal is applied to the input to said amplifier;
    a first photo emitter electrically connected to said amplifier output to be activated when the output of said amplifier is positive;
    a second photo emitter electrically connected to said amplifier output to be activated when the output of said amplifier is negative;
    a first photo detector, optically coupled to but electrically isolated from said first photo emitter, operable as a switching device which is turned on when said first photo emitter is activated;
    a second photo detector, optically coupled to but electrically isolated from said second photo emitter, operable as a switching device which is turned on when said second photo emitter is activated;
    power supply means having said first photo detector and said second photo detector connected thereto for providing a series of positive and negative output pulses as said first and second photo detectors are switched on and off; and,
    pulse to analog converting means connected to receive the series of positive and negative pulses for converting them to an analog signal which is representative of but electrically isolated from the analog signal applied to said input.

2. An analog signal isolator as claimed in claim 1 comprising:
    an oscillator connected to an input of said amplifier.

3. An analog signal isolator as claimed in claim 1 wherein said pulse to analog converting means comprises:
    an averaging circuit connected to provide an output which approaches the average of the signals applied thereto.

4. An analog isolator as claimed in claim 1 wherein said pulse to analog converting means comprises:
    a first output amplifier for increasing the strength of the positive and negative pulses;
    an averaging circuit connected to the output of said first output amplifier providing an output signal representative of the average value of the pulses applied thereto; and,
    a second output amplifier for increasing the averaged output signal strength from said averaging circuit to provide an output analog signal representative of the analog signal applied to said input.

5. A signal isolator comprising:
    an input terminal for receiving an analog input signal;
    signal converting means connected to said input terminal for converting the analog signal at said input to a series of positive and negative output pulses;
    said signal converting means comprises amplifier means for providing the series of pulses in response to the analog input signal, averaging means connected to the output of said amplifier means for providing some averaging of the pulses, and feedback means connected between said averaging means and said amplifier means for providing a negative feedback signal;
    a first photo emitter connected to be activated when said signal converting means output is positive;
    a second photo emitter connected to be activated when said signal converting means output is negative;
    a first photo detector operably associated with said first photo emitter, operable in a switching mode, to be switched on when said first photo emitter is activated;
    a second photo detector operably associated with said second photo emitter, operable in a switching mode, to be switched on when said second photo emitter is activated;
    a power supply having said first first photo detector and said second photo detector connected thereto, to provide a series of positive and negative output pulses corresponding to the series of positive and negative pulses from said signal converting means; and,
    output means connected to said first photo detector and said second photo detector to receive the series of output pulses for converting the series of output pulses to an analog signal corresponding to the analog signal applied to said input terminal.

6. A signal isolator as claimed in claim 5 wherein said signal converting means comprises:
    said amplifier means connected to provide two-state modulation of the analog input signal applied to said input terminal.

7. A signal isolator as claimed in claim 5 wherein said signal converting means comprises:
    an electrical circuit means connected to provide constant frequency pulse modulation of the analog signal applied to said input terminal.

8. An analog signal isolator comprising:
    a switching amplifier having an input and an output, which is switchable between a positive level and a negative level in response to the signal level applied to its input;

averaging means connected to the output of said amplifier for providing some averaging of the switching output of said amplifier;

a feedback circuit connected to said averaging means for feeding back to the input of said switching amplifier a varying signal;

an input for receiving an analog signal which is combined with the feedback signal from said feedback circuit and applied to the input of said amplifier;

a first photo emitting device connected to the output of said amplifier to be activated when the output of said amplifier is switched positive;

a second photo emitting device connected to the output of said amplifier to be activated when the output of said amplifier is switched negative;

a first photo sensitive device optically coupled to said first photo emitting device to be activated when said first photo emitting device is activated and being operable as a switching device to be either on or off;

a second photo sensitive device optically coupled to said second photo emitting device to be activated when said second photo emitting device is activated and being operable as a switching device to be either on or off;

said first photo sensitive device and said second photo sensitive device being interconnectable with a power supply to provide a pulse output which varies between a positive and negative level and whose average value corresponds to the analog signal applied to said input.

9. A switching amplifier for amplifying an analog signal having electrical isolation between the input and the output comprising:

an input for receiving an analog signal;

an amplifier having an input and an output switchable between a positive voltage level and a negative voltage level in response to the signal applied to its input;

averaging means connected to the output of said amplifier for averaging the positive and negative output levels of said amplifier;

a feedback circuit connected between the averaging means and the input of said amplifier to provide a feedback signal which is combined with the analog signal received on said input to provide the signal applied to the amplifier input;

an optical isolator comprising two photo transmitters disposed in parallel and being connected to the output of said amplifier one of which conducts when said amplifier output is positive and the other conducts when said amplifier output is negative and a pair of photo detectors optically coupled to said pair of optical transmitters and being operable as on and off switching devices in response to activation of the associated optical transmitter to provide a signal equivalent to the switching signal output of said amplifier; and, averaging means connected to said pair of photo detectors for averaging the electrical signal provided therefrom.

10. A switching amplifier as claimed in claim 9 comprising:

an oscillator connected to an input of said amplifier for providing under some operating conditions constant frequency switching of said amplifier.

11. A switching amplifier as claimed in claim 9 comprising:

a second pair of photo transmitters each connected in series with one of said two photo transmitters;

a second pair of photo detectors optically coupled to said second pair of photo transmitters and interconnected with said pair of photo detectors to provide a bridge configured output.

12. An analog signal isolator comprising:

an input for receiving an analog signal;

a hysteretic switching device having an input and an output on which are provided a series of pulses in response to the signal applied to its input;

averaging means for providing some averaging of the pulses from said hysteretic switching device;

combining means connected between said input and the input to said hysteretic switching device for combining the signals applied thereto and providing the combined signal to the input of said hysteretic switching device;

feedback means connected between said averaging means and said combining means for providing a negative feedback signal from the averaging means to an input of said combining means;

optical coupling means operably responsive to the series of pulses on the output of said hysteretic switching device for providing a series of pulses, representative of the pulses from said hysteretic switching device, which are electrically isolated from said hysteretic switching device; and, pulse to analog converting means connected to receive the series of pulses from said optical coupling means and converting them to an analog signal which is representative of but electrically isolated from the analog signal applied to said input.

13. An analog signal isolator as claimed in claim 12 comprising:

an oscillator supplying a constant frequency input to said combining means of a magnitude to cause said hysteretic switching device, at least some of the time, to switch at the oscillator frequency.

14. An analog signal isolator as claimed in claim 12 wherein said optical coupling means comprises:

a plurality of switching elements disposed in a bridge configuration to provide the pulse output.

15. An analog signal isolator as claimed in claim 14 wherein said pulse to analog converting means comprises:

averaging means for averaging the series of pulses applied thereto.

* * * * *

UNITED STATES PATENT AND TRADEMARK OFFICE
CERTIFICATE OF CORRECTION

PATENT NO. : 4,066,973
DATED : January 3, 1978
INVENTOR(S) : Paul F. McNally

It is certified that error appears in the above-identified patent and that said Letters Patent are hereby corrected as shown below:

Column 2, line 62, "transducer" should read --transistor--; line 67, "couplers" should read --coupler--.

Claim 5, line 27, "first" second occurrence should be deleted.

Signed and Sealed this

Eleventh Day of April 1978

[SEAL]

Attest:

RUTH C. MASON
*Attesting Officer*

LUTRELLE F. PARKER
*Acting Commissioner of Patents and Trademarks*